United States Patent [19]

Wagner

[11] Patent Number: 4,590,434
[45] Date of Patent: May 20, 1986

[54] HIGH DYNAMIC RANGE AMPLIFIER WITH LOW NOISE AND LOW DISTORTION

[75] Inventor: Walter D. Wagner, Nashua, N.H.

[73] Assignee: New England Microwave Corporation, Hudson, N.H.

[21] Appl. No.: 492,128

[22] Filed: May 6, 1983

[51] Int. Cl.$^4$ ............................................. H03F 1/34
[52] U.S. Cl. ...................... 330/102; 330/79; 330/294
[58] Field of Search .................. 330/53, 79, 98, 102, 330/171, 286, 294, 105

[56] References Cited

U.S. PATENT DOCUMENTS 3,440,553  4/1969  Gerard ............................ 330/102
4,414,690 11/1983  Nordholt et al. ................ 330/79 X
4,460,875  7/1984  Harman ........................... 330/53 X Primary Examiner—Eugene R. LaRoche
Assistant Examiner—Steven J. Mottola
Attorney, Agent, or Firm—Berman, Aisenberg & Platt

[57] ABSTRACT

An amplifier uses non-dissipative elements to provide current and voltage feedback. The base amplifier has two input terminals, and the current and voltage feedback signals are applied to respective input terminals. The non-dissipative elements may be either transformers or coupled-line pairs. These elements allow broad band operation with low noise. The feedback configuration results in higher input impedance.

13 Claims, 6 Drawing Figures

HIGH DYNAMIC RANGE AMPLIFIER WITH LOW NOISE AND LOW DISTORTION

TECHNICAL FIELD

This invention relates to the field of amplifiers, particularly broad-band amplifiers utilizing feedback.

BACKGROUND ART

The typical negative feedback circuit for an amplifier uses only resistive elements. A resistor dissipates power, thus losing a significant amount of power and resulting in lower power being delivered to the amplifier load. Operation of the amplifier at high power is precluded since the feedback signal must also have high power, but large amounts of powr are dissipated by the feedback network. The typical amplifier thus cannot achieve an optimum level of distortion.

A resistor also introduces noise into a circuit. Thus, an amplifier with a resistive feedback network suffers from the noise introduced by the resistors.

The feedback network is typically designed to control gain and the input and output impedances of the amplifier. This feedback networks employ resistive elements and also affect the power efficiency and signal-to-noise ratio of the amplifier.

It has been suggested to avoid the disadvantages inherent in resistive feedback networks by using elements in the feedback network which do not dissiplate power. Ernst H. Nordholt, in an article entitled "Classes and Properties of Multiloop Negative-Feedback Amplifiers"; *IEEE Transactions on Circuits and Systems*, March, 1981, calls these elements "non-energic." The ideal gyrator and the ideal transformer are cited as examples of such non-energic elements, and Nordholt describes a number of amplifier configurations which employ non-energic elements in the feedback network. For example, FIG. 6 of the Nordholt article shows a configuration using two transformers for the feedback elements, wherein both of the transformers are connected to the inverting input of an amplifier.

It has also been suggested to use a directional coupler in the feedback network. U.S. Pat. No. 3,624,536 (Norton) describes an amplifier which utilizes a directional coupler to provide the feedback signal. The Norton directional coupler is a four-port device wherein the individual ports of two sets of ports (a-c and b-d) are isolated from each other. Ports (a-b) are coupled and are in-phase, and ports (a-d) are coupled 180 degrees out of phase. Ports (b-c) are coupled in phase. The input signal is applied to port (a), and port (b) is connected to the input of the amplifier. Port (c) is connected to the output of the amplifier and port (d) is the output of the device.

The majority of the feedback in the Norton circuit occurs through the connection of port (c) to port (b) without phase shift.

U.S. Pat. No. 4,042,887 (Meade, et al.) discloses an amplifier also using a plurality of directional couplers to provide negative feedback to the amplifier.

STATEMENT OF THE INVENTION

An amplifier having a directional coupler feedback network as shown in the patents to Norton and Meade et al. suffers from several disadvantages. The bandwidth of the amplifier is limited by the fact that the phase of the output signal of a transmission line directional coupler is a function of frequency at microwave frequencies. This means that the amplifier may become unstable at certain frequencies, thus requiring the bandwidth to be limited. This bandwidth limitation is a serious drawback to the directional coupler type of feedback network.

The article by Nordholt shows transformers in the feedback network. But, the Nordholt analysis assumes an ideal amplifier having a high input impedance. At certain frequencies, for example, radio frequencies (RF), the ideal amplifier does not exist. Thus, the Nordholt circuit is not useful for many applications.

Appicant's invention overcomes the above disadvantages by using "non-energic" or "lossless" elements in a unique feedback network. In one embodiment, Applicant employs transformers to provide feedback signals. In a second embodiment Applicant employs two coupled line pairs having distributed coupling to provide the feedback signals.

These elements are non-dissipative and thus permit operation at significant power without sacrificing power in the feedback network. Furthermore, the transformer and coupler line pair allow a broad-band operation since the amplitude relationship between input and output signals depends on the turn ratio and is thus independent of frequency.

Applicant's feedback network is also configured so that the amplifier presents a large input impedance, thus approximating an ideal amplifier.

The feedback network of the invention uses an element to sense the output signal as functions of output current and output voltage respectively. The current output is applied to the input as a current, and the voltage output is applied as a voltage. This is known in the art as voltage-series and current-shunt feedback.

The amplifier of the invention has at least three terminals. Two of the terminals are input terminals and the third is an output terminal. The amplifier may, for example, be a single transistor having the base and emitter as input terminals, an FET, or a plurality of elements, for example an operational amplifier having inverting and non-inverting terminals.

The voltage and current signals are applied to the input terminals in such a manner that the feedback is "negative." That is, the amplifier is stable. An advantage of Applicant's feedback network is that the two transformers, or two couple-line pairs, produce current and voltage signals which have a fixed phase relationship. This is an important feature of the invention and produces a stable amplifier.

It is an object of this invention to provide a broad-band amplifier having a low noise figure.

It is a further object of this invention to provide an amplifier having low distortion.

DETAILED DESCRIPTION OF THE INVENTION

Figure 1:
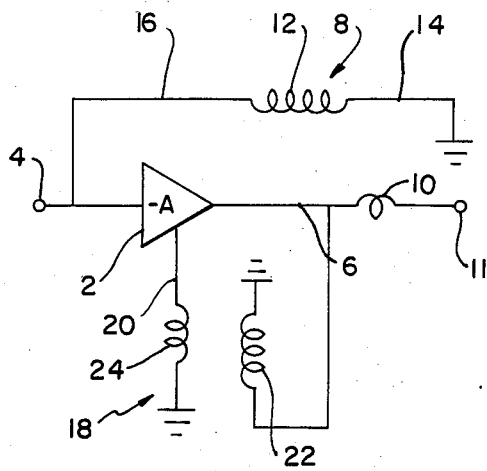
FIG. 1 is a schematic of the invention applied to an inverting amplifier.

FIG. 1 shows an amplifier circuit having an inverting amplifier 2 with an input terminal 4 and an output terminal 6. A first transformer 8 is used to provide current-shunt feedback to the input of amplifier 2. Transformer 8 includes a primary winding 10 which is connected to the output terminal 6 of the amplifier 2. The output of the amplifier with feedback appears at terminal 11. A secondary winding 12 has one terminal 14 connected to ground and a second terminal 16 connected to the input 4 of the amplifier 2. The reduced current signal from transformer 8 is applied to the input as a current.

A second transformer 18 provides voltage series feedback to a third terminal 20 of the amplifier 2. The primary winding 22 of the transformer 18 is connected to the output 6 of the amplifier 2 and to ground. The secondary winding 24 of the transformer 18 has one terminal connected to ground and the second terminal connected to the third terminal 20 of the amplifier 2 to feedback a reduced voltage signal.

Figure 2:
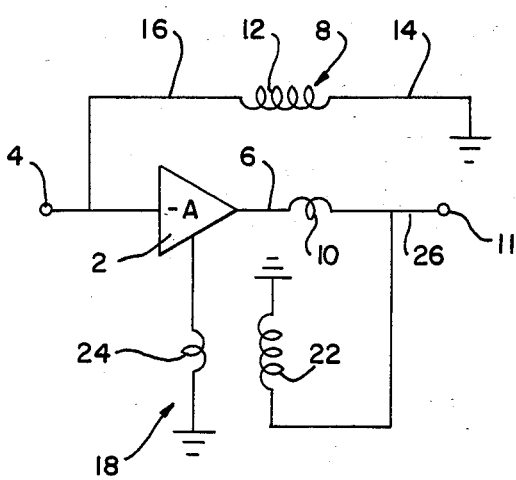
FIG. 2 is a schematic of the invention also applied to an inverting amplifier.
Figure 4:
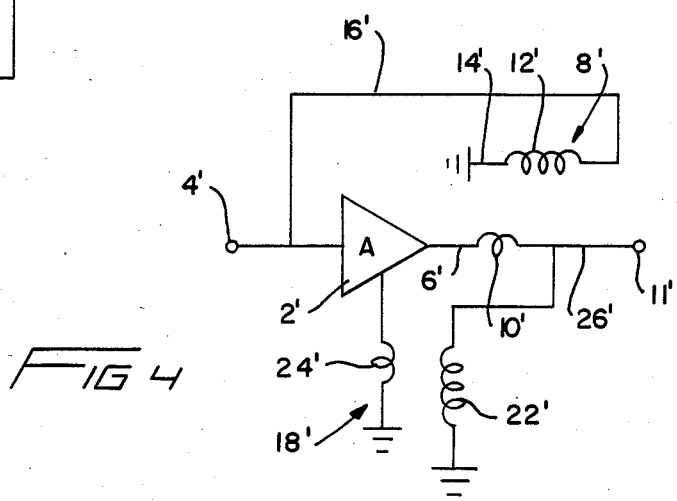
FIG. 4 is a schematic of another embodiment of the invention applied to a non-inverting amplifier.

FIG. 2 shows a configuration similar to that shown in FIG. 1, the difference being that the primary 22 of the transformer 18 is connected to the output 26 of the primary winding 10 of the transformer 8.

Figure 3:
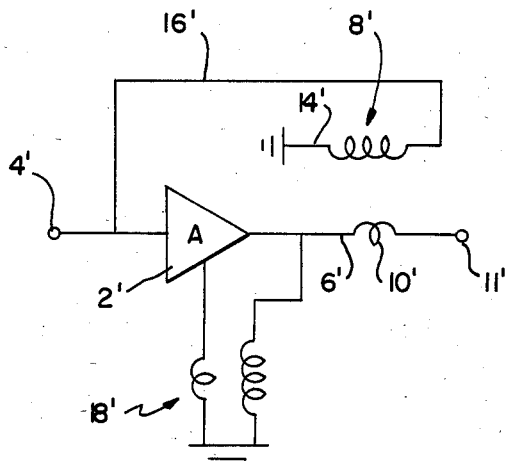
FIG. 3 is a schematic of the invention applied to a non-inverting amplifier.

FIG. 3 shows a configuration wherein the invention is applied to non-inverting amplifier 2'. The windings of the transformers 8' and 18' are arranged to provide the necessary feedback to the amplifier. Since the elements are similar, except for the direction of the winding, each of the elements in FIGS. 3 and 4 have been given primed numerals corresponding to the unprimed numerals in FIGS. 1 and 2. It will be appreciated by those of skill in the art that the feedback configurations shown in FIGS. 1 through 4 are quite advantageous. The transformers provide feedback signals having amplitudes which are independent of frequency resulting in a broad-band amplifier. Also, the relative phases of the current and voltage signals are constant over a large frequency range. This feedback configuration increases the input impedance of the amplifier resulting in a closer approximation to an ideal amplifier.

The invention may be applied to an operational amplifier by using the configurations shown in FIGS. 1 through 4. The inverting and non-inverting terminals would correspond to terminals 4 and 20. In fact, the principles of the invention may be applied to any three-terminal amplifier.

Figure 5:
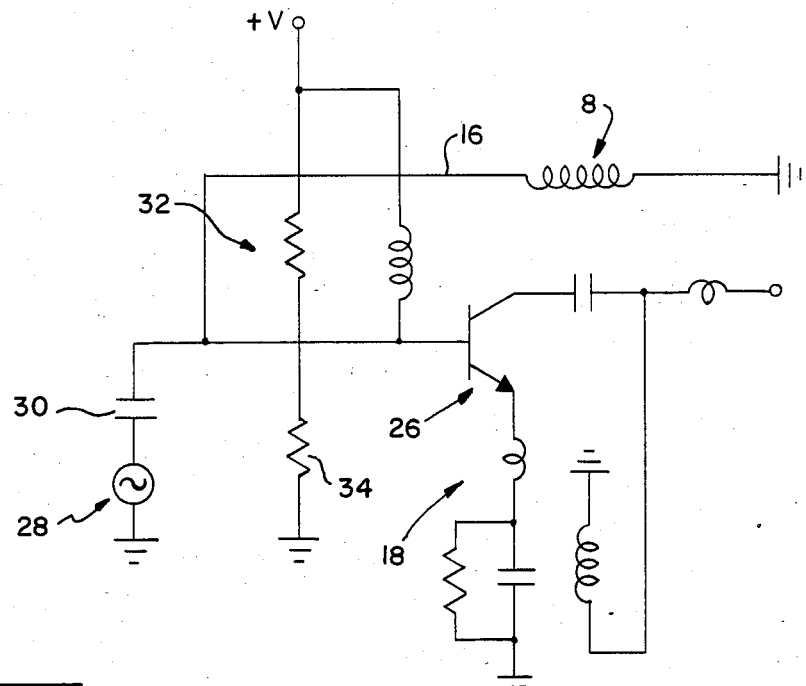
FIG. 5 is a specific embodiment of the invention wherein the amplifier is a single transistor.

FIG. 5 shows an embodiment of the invention wherein a transistor 26 is used as the amplifier. The input signal 28 is applied to the base of the transistor 26 through a coupling capacitor 30. A voltage dividing network comprising resistors 32 and 34 and a voltage (V) is used to provide a d.c. bias to the base of transistor 26. Transformer 8 senses output current and feeds a current back to the base of transistor 26. Transformer 18 senses output voltage and feeds a voltage back to the emitter of transistor 26. The voltage applied to the emitter of the transistor will appear at the base of the transistor resulting in voltage and current feedback.

Tests on the circuit in FIG. 5 using a NE41632 transistor and transformers having turn ratios of either 3:1 or 4:1, shows an input signal reflection coefficient ($s_{11}$) of from 0.01 to 0.04 over the frequency range of 10 MHz to 500 MHz. At a frequency of 10 MHz, the amplifier has a 1 db compression at 20 dBm.

Figure 6:
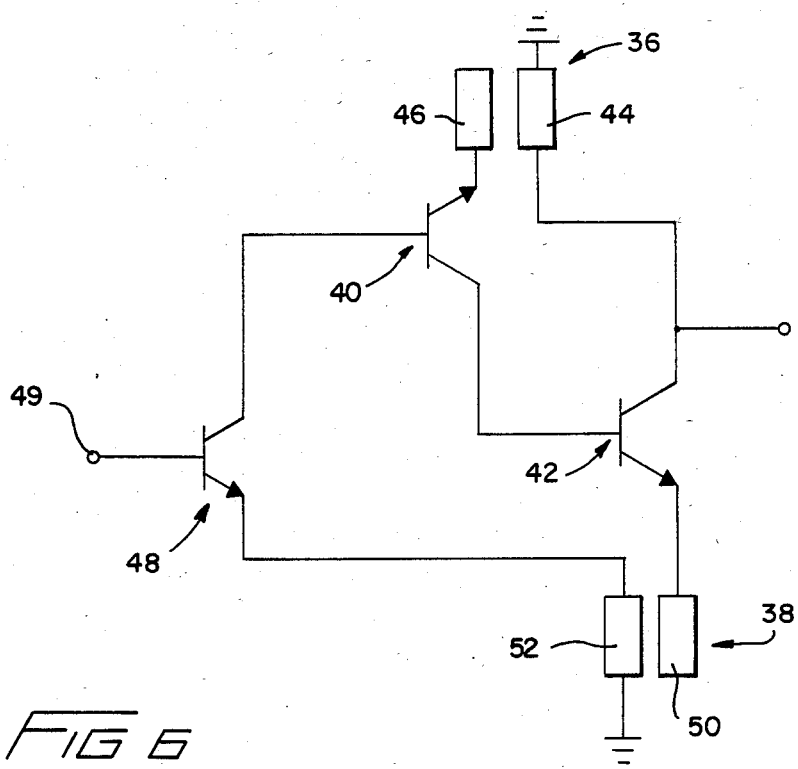
FIG. 6 is a schematic of the invention using coupled-line pairs in the feedback network.

The configuration shown in FIG. 6 employs a distributed coupling realization of the invention. The coupled line pair 36 is used to provide voltage feedback, and the coupled line pair 38 is used to provide current feedback. In the particular arrangement shown in FIG. 6 transistors 40 and 42 are in a cascade arrangement to provide an amplifier. The coupled line pair 36 includes a conductor 44 and a conductor 46. The conductor 44 samples the output current. Conductor 46 senses the current in conductor 44 and develops a voltage which is applied to the emitter of transistor 40. This voltage appears at the base of transistor 40 because of the high impedance of the transistor, and voltage feedback is accomplished.

Transistor 48 is a coupling transistor which is connected to the base of transistor 40.

The coupled-line pair 38 includes conductors 50 and 52. Conductor 42 samples the output signal and feeds it back to transistor 48 as a current which couples the signal to the base of transistor 40. The base 40 of transistor 48 is the input terminal of the device.

It will be appreciated by those of skill in the art that the distributed element devices 36 and 38 of FIG. 6 act as the transformers in FIGS. 1–5, but have distinct advantages in bandwidth and power loss. A coupled line pair may be described by its even mode impedance and its odd mode impedance. While any coupled-line pair will operate in the configuration shown in FIG. 6, the particular parameters chosen will depend upon the parameters of the transistors 40 and 42 and the desired operation of the device. The use of coupled line pairs offers a degree of freedom to design for a particular bandwidth. Operation at microwave frequencies is particularly facilitated in the arrangement of FIG. 6.

It is claimed:

1. Apparatus for amplification of an input signal comprising
    a three-terminal amplifier having first and second input terminals and an output terminal,
    first feedback means comprising a first non-dissipative means connected to said output terminal and to said first input terminal for providing current feedback,
    second feedback means comprising a second non-dissipative means connected to said output terminal and to said second input terminal of said amplifier to provide a voltage feedback in series with an input signal.

2. The apparatus of claim 1 wherein said first and second feedback means are first and second transformers respectively.

3. The apparatus of claim 2 wherein primary windings of said first and second transformers are connected to said output terminal of said amplifier.

4. The apparatus of claim 2 wherein a primary winding of said first transformer is connected to said output terminal, and the primary winding of said second transformer is connected to primary terminal of said winding of said first transformer remote from said output terminal.

5. The apparatus of claim 3 wherein said amplifier is an inverting amplifier.

6. The apparatus of claim 3 wherein said amplifier is a non-inverting amplifier.

7. The apparatus of claim 4 wherein said amplifier is an inverting amplifier.

8. The apparatus of claim 4 wherein said amplifier is a non-inverting amplifier.

9. The apparatus of claim 1 wherein said amplifier is a transistor, said first input terminal is the base of said transistor, and said second input terminal is the emitter of said transistor.

10. The apparatus of claim 1 wherein each of said first and second non-dissipative means is a coupled-line pair.

11. An amplifier comprising:
a first transistor,
a second transistor the collector of said first transistor being connected to the base of said second transistor,
a first conductor of a first coupled line pair being connected to the emitter of said second transistor and a second conductor of said first coupled line pair connected to the base of said first transistor to provide a distributed coupling current feedback, and,
a first conductor of a second coupled line pair connected to the collector of said second transistor and a second conductor of said second coupled line pair being connected to the emitter of said first transistor to provide a distributed coupling voltage feedback.

12. The amplifier of claim 11 including a coupling transistor, the collector of said coupling transistor being connected to said base of said first transistor, said second conductor of said first coupled-line pair being connected to the emitter of said third transistor.

13. Apparatus according to claim 1 wherein said current feedback is in shunt with said input signal.

* * * * *